United States Patent
Tuo et al.

(10) Patent No.: US 10,735,108 B2
(45) Date of Patent: Aug. 4, 2020

(54) METHOD FOR SUPPRESSING LOCAL OSCILLATOR LEAKAGE IN MICROWAVE CHIP AND APPARATUS THEREOF

(71) Applicant: Huawei Technologies Co., Ltd., Shenzhen, Guangdong (CN)

(72) Inventors: Yong Tuo, Xi'an (CN); Wentao Cao, Xi'an (CN); Hongliang Mao, Xi'an (CN); Liguo Sun, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 49 days.

(21) Appl. No.: 16/210,847

(22) Filed: Dec. 5, 2018

(65) Prior Publication Data
US 2019/0115987 A1   Apr. 18, 2019

Related U.S. Application Data

(63) Continuation of application No. PCT/CN2016/085004, filed on Jun. 6, 2016.

(51) Int. Cl.
H04B 15/04 (2006.01)
H03D 7/16 (2006.01)
(Continued)

(52) U.S. Cl.
CPC ............ *H04B 15/04* (2013.01); *H03D 3/008* (2013.01); *H03D 7/165* (2013.01);
(Continued)

(58) Field of Classification Search
None
See application file for complete search history.

(56) References Cited

U.S. PATENT DOCUMENTS 3,681,697 A * 8/1972 Moroney ............ H03D 7/1408
455/313
4,947,062 A * 8/1990 Weiner ................ H03D 7/1441
327/105
(Continued)

FOREIGN PATENT DOCUMENTS

CN   101272373 A   9/2008
CN   102270965 A   12/2011
(Continued)

OTHER PUBLICATIONS

Qi Xiuzhen,"Design and Implementation of Zero Intermediate Frequency Transmitters",Electronic Sci. & Tech. /Mar. 15, 2014,total 4 pages.
(Continued)

*Primary Examiner* — Bunjob Jaroenchonwanit
(74) *Attorney, Agent, or Firm* — Kilpatrick Townsend & Stockton LLP

(57) ABSTRACT

In embodiments of the present disclosure, weighting on a direct current component coefficient $dc_i'$ of an I-channel signal and a direct current component coefficient $dc_q'$ of a Q-channel signal is performed based on spatial leakage factors k1 and k2 of a microwave chip and a current attenuation amount of a tunable attenuator, to determine a corrected direct current component coefficient $dc_i$ of the I-channel signal and a corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal.

17 Claims, 7 Drawing Sheets

(51) Int. Cl.
*H03D 3/00* (2006.01)
*H03K 5/1252* (2006.01)
*H04B 1/44* (2006.01)
*H04L 5/14* (2006.01)
*H03K 5/00* (2006.01)

(52) U.S. Cl.
CPC ............ *H03K 5/1252* (2013.01); *H04B 1/44* (2013.01); *H04L 5/1461* (2013.01); *H03D 2200/009* (2013.01); *H03K 2005/00286* (2013.01)

(56) References Cited

U.S. PATENT DOCUMENTS

| | | | | |
|---|---|---|---|---|
| 5,060,298 A * | 10/1991 | Waugh | ............... | H03D 7/1441 330/277 |
| 5,068,918 A * | 11/1991 | Verheijen | ............... | H03D 5/00 455/142 |
| 5,263,198 A * | 11/1993 | Geddes | ............... | H03D 7/125 455/325 |
| 5,535,245 A * | 7/1996 | Kim | ............... | G11B 20/10 375/261 |
| 5,809,409 A * | 9/1998 | Itoh | ............... | H03D 9/0675 333/128 |
| 5,953,644 A * | 9/1999 | Kool | ............... | H03D 9/0641 343/786 |
| 6,122,329 A * | 9/2000 | Zai | ............... | G01S 13/751 342/42 |
| 6,249,876 B1 * | 6/2001 | Balakrishnan | ........... | H02M 1/12 |
| 6,832,077 B1 * | 12/2004 | McKitterick | ............ | H04B 1/44 330/250 |
| 7,809,338 B2 * | 10/2010 | Tsfati | ............... | H03B 19/00 327/156 |
| 9,887,862 B2 * | 2/2018 | Zhou | ............... | H04L 25/08 |
| 9,992,722 B2 * | 6/2018 | Li | ............... | H04W 24/08 |
| 10,205,461 B2 * | 2/2019 | Aleksi | ............... | H03L 7/24 |
| 2003/0013428 A1 * | 1/2003 | Marques | ............ | H04B 1/0003 455/259 |
| 2003/0043933 A1 * | 3/2003 | Kintis | ............... | H04B 1/28 375/308 |
| 2003/0078020 A1 * | 4/2003 | Kintis | ............... | H03D 7/165 455/209 |
| 2007/0222503 A1 * | 9/2007 | Murofushi | ............ | H04L 25/061 329/304 |
| 2009/0130981 A1 * | 5/2009 | Nagai | ............... | G06K 19/0723 455/63.1 |
| 2010/0091688 A1 * | 4/2010 | Staszewski | .......... | H03D 7/1441 370/277 |
| 2011/0014890 A1 * | 1/2011 | Ajram | ............... | H02M 3/156 455/299 |
| 2011/0053547 A1 * | 3/2011 | Yahav | ............... | H03D 7/00 455/317 |
| 2012/0147878 A1 * | 6/2012 | Yoshikawa | .......... | H04L 1/0007 370/345 |
| 2012/0321002 A1 * | 12/2012 | Akita | ............... | H04B 1/0475 375/259 |
| 2014/0028372 A1 * | 1/2014 | Cai | ............... | H03D 7/00 327/355 |
| 2015/0171946 A1 * | 6/2015 | Hosoya | ............... | H04B 7/0695 375/267 |
| 2016/0056764 A1 * | 2/2016 | Tham | ............... | H03D 3/008 327/355 |
| 2016/0164569 A1 * | 6/2016 | Morton | ............... | H04B 1/68 375/296 |
| 2016/0277058 A1 * | 9/2016 | Zhai | ............... | H04B 1/48 |
| 2017/0302318 A1 * | 10/2017 | Okuhata | ............ | H04B 1/10 |
| 2017/0366279 A1 * | 12/2017 | Nakanishi | ............ | H04B 15/04 |
| 2018/0026619 A1 * | 1/2018 | Murao | ............... | H04B 1/04 370/278 |
| 2018/0262221 A1 * | 9/2018 | Ji | ............... | H04B 1/40 |
| 2019/0107601 A1 * | 4/2019 | Gupta | ............... | G01S 7/352 |
| 2019/0190767 A1 * | 6/2019 | Kim | ............... | H04L 27/3427 |

FOREIGN PATENT DOCUMENTS

| | | |
|---|---|---|
| CN | 102510265 A | 6/2012 |
| CN | 104158552 A | 11/2014 |
| CN | 105471468 A | 4/2016 |

OTHER PUBLICATIONS

Ji-Seon Paek et al.,"Analysis and Design of CMOS Amplitude Modulator With Digitally Controlled Variable Attenuator", IEEE Transactions on Microwave Theory and Techniques, Vol. 59, No. 3, Mar. 2011, total 14 pages.

* cited by examiner

200

```
┌─────────────────────────────────────────────────────────────┐
│   Obtain a current attenuation amount of a variable attenuator  │──── 210
└─────────────────────────────────────────────────────────────┘
                              │
┌─────────────────────────────────────────────────────────────┐
│ Obtain a direct current component coefficient dc_i' of an I-channel signal and │
│ a direct current component coefficient dc_q' of a Q-channel signal based on a  │──── 220
│    local oscillator signal that leaks in front of the variable attenuator      │
└─────────────────────────────────────────────────────────────┘
                              │
┌─────────────────────────────────────────────────────────────┐
│ Perform weighting on the direct current component coefficient dc_i' of the I-  │
│  channel signal and the direct current component coefficient dc_q' of the Q-   │
│  channel signal based on spatial leakage factors k1 and k2 of a microwave     │
│    chip and the current attenuation amount of the tunable attenuator, to      │
│    determine a corrected direct current component coefficient dc_i of the I-  │
│  channel signal and a corrected direct current component coefficient dc_q of  │──── 230
│    the Q-channel signal, where the spatial leakage factors k1 and k2 are      │
│      respectively a parallel component coefficient and a perpendicular        │
│      component coefficient of a vector of a local oscillator signal that leaks │
│   behind the variable attenuator on a vector of the local oscillator signal that │
│                 leaks in front of the variable attenuator                     │
└─────────────────────────────────────────────────────────────┘
                              │
┌─────────────────────────────────────────────────────────────┐
│  Send the I-channel signal with the coefficient of dc_i to a first frequency  │
│ mixer, and send the Q-channel signal with the coefficient of dc_q to a second │──── 240
│                            frequency mixer                                    │
└─────────────────────────────────────────────────────────────┘
```

FIG. 2

METHOD FOR SUPPRESSING LOCAL OSCILLATOR LEAKAGE IN MICROWAVE CHIP AND APPARATUS THEREOF

CROSS REFERENCE TO RELATED APPLICATION

This application is a continuation of International Application No. PCT/CN2016/085004, filed on Jun. 6, 2016, which is hereby incorporated by reference in its entirety.

TECHNICAL FIELD

The present application relates to the field of integrated circuit technologies, and more specifically, to a method for suppressing local oscillator leakage in a microwave chip and an apparatus thereof.

BACKGROUND

With development of highly integrated microwave chips, a problem of spatial leakage in a chip has become a bottleneck of microwave chip performance improvement. For a common microwave integrated chip with an architecture of an upconverter and a tunable attenuator, local oscillator leakage caused by insufficient isolation is hard to be resolved by using a conventional quadrature modulation correction (QMC) solution. A local oscillator suppression filter is hard to be implemented in a high frequency band, and cannot be integrated inside the chip. Local oscillator leakage seriously affects transmit power precision, transmitter spurious emission, and link linearity.

Therefore, how to effectively suppress local oscillator leakage caused by insufficient spatial isolation inside a microwave chip is an issue to be resolved urgently.

SUMMARY

Embodiments of the present disclosure provide a method for suppressing local oscillator leakage in a microwave chip and an apparatus thereof, so that local oscillator leakage in the microwave chip can be effectively suppressed.

According to a first aspect, a method for suppressing local oscillator leakage in a microwave chip is provided, where the microwave chip includes an oscillator, a phase shifter, a first frequency mixer, a second frequency mixer, a combiner, and a variable attenuator, the oscillator is configured to generate a local oscillator signal, the phase shifter is configured to convert the local oscillator signal into an inphase local oscillator signal component and a quadrature local oscillator signal component, the first frequency mixer is configured to perform frequency mixing on an inphase I-channel signal and the inphase local oscillator signal component, the second frequency mixer is configured to perform frequency mixing on a quadrature Q-channel signal and the quadrature local oscillator signal component, the combiner is configured to perform frequency combination on a signal obtained through frequency mixing of the first frequency mixer and a signal obtained through frequency mixing of the second frequency mixer, and output an obtained signal to the variable attenuator, and the method includes: obtaining a current attenuation amount of the variable attenuator; obtaining a direct current component coefficient $dc_i'$ of the I-channel signal and a direct current component coefficient $dc_q'$ of the Q-channel signal based on a local oscillator signal that leaks in front of the variable attenuator; performing weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, where the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and sending the I-channel signal with the coefficient of $dc_i$ to the first frequency mixer, and sending the Q-channel signal with the coefficient of $dc_q$ to the second frequency mixer.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

With reference to the first aspect, in a first possible implementation of the first aspect, the foregoing method further includes: obtaining a power value of an output signal that is generated by the microwave chip in each of at least three working states and an attenuation amount of the variable attenuator in each working state; and determining the spatial leakage factors k1 and k2 of the microwave chip based on the power value of the signal that is generated in each of the at least three working states and the attenuation amount of the variable attenuator in each working state.

It should be understood that, the spatial leakage factors k1 and k2 are respectively the parallel component coefficient and the perpendicular component coefficient of the vector of the local oscillator signal that leaks behind the variable attenuator on the vector of the local oscillator signal that leaks in front of the variable attenuator. Therefore, the local oscillator signal that leaks behind the tunable attenuator may be obtained by obtaining the power value of the output signal generated by the microwave chip, the local oscillator signal that leaks in front of the tunable attenuator may be obtained by obtaining the power value of the output signal generated by the microwave chip and the attenuation amount of the tunable attenuator, and the spatial leakage factors k1 and k2 of the microwave chip may be determined based on statuses of local oscillator signal leakage in three working states.

With reference to the first aspect or the foregoing implementation of the first aspect, in a second possible implementation of the first aspect, the performing weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal includes: determining the corrected direct current component coefficient $dc_i$ of the I-channel signal and the corrected direct current component coefficient $dc_q$ of the Q-channel signal by using the following formulas:

$$dc_i = \frac{1}{A}[dc_i' * (A + k1) + dc_q' * k2]$$

$$dc_q = \frac{1}{A}[dc_q' * (A + k1) + dc_i' * k2],$$

where

A is an attenuation value of the variable attenuator.

In other words, the corrected direct current component coefficient $dc_i$ of the I-channel signal and the corrected direct current component coefficient $dc_q$ of the Q-channel signal can be obtained by performing weighting on the direct current component coefficient $dc_i'$ of the I-channel signal and the direct current component coefficient $dc_q'$ of the Q-channel signal by using the leakage factors k1 and k2 and the attenuation amount of the tunable attenuator.

With reference to the first aspect and the foregoing implementation of the first aspect, in a third possible implementation of the first aspect, a parameter for representing the working state includes at least one of the following: a power of a local oscillator signal of the microwave chip, a power of an input modulation signal of the microwave chip, the attenuation amount of the attenuator, the direct current component coefficient $dc_i'$ of the I-channel signal, and the direct current component coefficient $dc_q'$ of the Q-channel signal.

In other words, a working state of the microwave chip varies if any one of the foregoing parameters varies. It should be understood that, another parameter that can make the working state of the microwave chip vary also falls within the scope of the present disclosure.

With reference to the first aspect and the foregoing implementations of the first aspect, in a fourth possible implementation of the first aspect, the obtaining a power value of an output signal that is generated by the microwave chip in each of at least three working states and an attenuation amount of the variable attenuator in each working state includes: when the microwave chip is in a frequency division duplex working mode, obtaining, in an initialization process of the microwave chip, the power value of the output signal that is generated by the microwave chip in each of the at least three working states; or when the microwave chip is in a time division duplex working mode, obtaining, in an initialization process and/or a receiving timeslot of the microwave chip, the power value of the output signal that is generated by the microwave chip in each of the at least three working states.

According to a second aspect, an apparatus for suppressing local oscillator signal leakage in a microwave chip is provided, including: an obtaining unit, a determining unit, and a sending unit. The apparatus is configured to execute the foregoing method according to any one of the first aspect or the possible implementations of the first aspect.

According to a third aspect, a transceiver is provided, where the transceiver includes the apparatus for suppressing local oscillator signal leakage in a microwave chip according to the second aspect.

According to a fourth aspect, an apparatus is provided, including: a processor, a memory, a receiver, and a transmitter. The processor, the memory, and the receiver are connected by using a bus system. The memory is configured to store an instruction. The processor is configured to execute the instruction stored in the memory, to control the receiver to receive a signal and control the transmitter to send a signal, so that the apparatus executes the foregoing method according to any one of the first aspect or the possible implementations of the first aspect.

According to a fifth aspect, a computer readable medium is provided, configured to store a computer program. The computer program includes an instruction for executing the method according to any one of the first aspect or the possible implementations of the first aspect.

BRIEF DESCRIPTION OF DRAWINGS

FIG. 2 is a schematic flowchart of a method for suppressing local oscillator signal leakage in a microwave chip according to an embodiment of the present disclosure;

DESCRIPTION OF EMBODIMENTS

Figure 1:
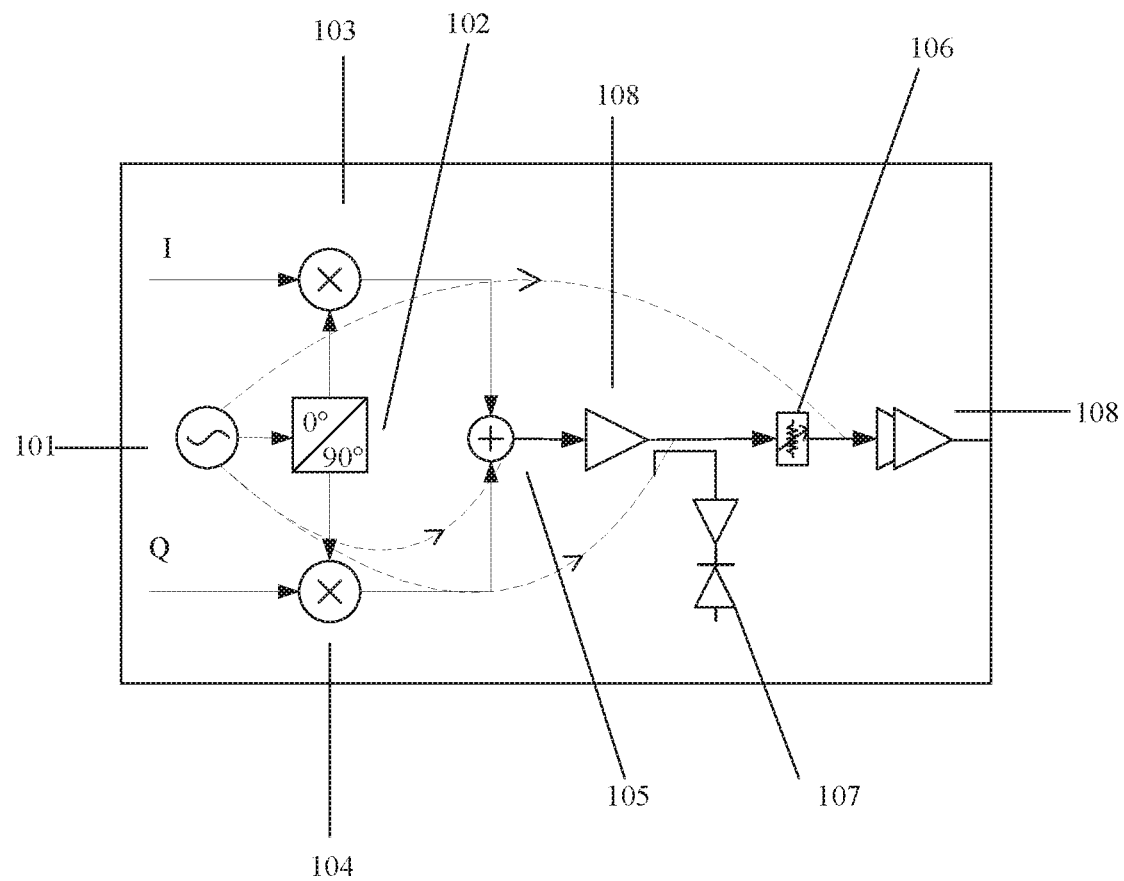
FIG. 1 is a schematic diagram of spatial leakage of a microwave chip according to an embodiment of the present disclosure.

FIG. 1 is a schematic diagram of spatial leakage of a microwave chip according to an embodiment of the present disclosure.

As shown in FIG. 1, the microwave chip includes an oscillator 101, a phase shifter 102, a first frequency mixer 103, a second frequency mixer 104, a combiner 105, a tunable attenuator 106, an envelope detector tube 107, an amplifier 108, and the like. The phase shifter 102, the first frequency mixer 103, the second frequency mixer 104, the combiner 105, and the like constitute an upconverter. Specifically, a local oscillator (LO) signal generated by the oscillator 101 passes through the phase shifter 101 and is converted into two quadrature signal components, where an inphase signal component of the local oscillator signal is sent to the first frequency mixer 103, and a quadrature signal component of the local oscillator signal is sent to the second frequency mixer 104; an inphase signal sent from a modulator is sent to the first frequency mixer 103, and is frequency-mixed with the inphase signal component of the local oscillator signal, where the inphase signal component is simply referred to as an I-channel signal; a quadrature signal component sent from the foregoing modulator is sent to the second frequency mixer 104, and is frequency-mixed with the quadrature signal component of the local oscillator signal, where the quadrature signal component is simply referred to as a Q-channel signal. A signal sent by the first frequency mixer 103 and a signal sent by the second frequency mixer 104 are added up by the combiner 105, and an obtained signal is output after passing through the subsequent amplifier 108, a coupler, the variable attenuator 106, and the like.

As shown in FIG. 1, spatial leakage generated by the microwave chip mainly includes the following parts: first, a direct current component of an I-channel signal that leaks in front of the variable attenuator 106 and a direct current component of a Q-channel signal that leaks in front of the variable attenuator 106; second, a local oscillator signal that leaks in front of the variable attenuator 106; and third, a local oscillator signal that leaks behind the variable attenuator 106. The first part of signal leakage may be corrected by using a QMC module, the second part of signal leakage may be corrected by the envelope detector tube 107 behind the variable attenuator 106, and the third part, namely, the local oscillator signal that leaks behind the variable attenuator 106 cannot be well corrected.

Specifically, for the microwave chip, when the variable attenuator 106 is in a fully attenuated state, an entire microwave signal that is output may be represented by using Formula (1):

$$Re\{e^{jw_c t}(r\cos(w_d) + dc_i + j(\sin(w_d t + \varphi) + dc_q))\} +$$
$$a\cos(w_c t + \theta_1) + b\cos(w_c t + \theta_2) =$$
$$\cos(w_c t)(r\cos(w_d t) + dc_i) - \sin(w_c t)[\sin(w_d t + \varphi) + dc_q] +$$
$$a\cos(w_c + \theta_1) + b\cos(w_c t + \theta_2) = \frac{r}{2}\cos(w_c t + w_d)t +$$
$$\frac{1}{2}\cos(w_c t + w_d t + \varphi) + dc_i\cos(w_c t) - dc_q\sin(w_c t) + a\cos(w_c + \theta_1) +$$
$$b\cos(w_c t + \theta_2) + \frac{r}{2}\cos(w_c t - w_d)t - \frac{1}{2}\cos(w_c t - w_d t - \varphi)$$

(1), where full attenuation of the variable attenuator 106 is a maximum attenuation amount calibrated by the tunable attenuator, where the maximum attenuation amount may be, for example, 25 dB or 28 dB, and is not limited in the present disclosure; r is a gain imbalance parameter, φ is a phase imbalance parameter, $dc_i$ is a direct current component coefficient of an I-channel signal, and $dc_q$ is a direct current component coefficient of a Q-channel signal.

Further, $$\frac{r}{2}\cos(w_c t + w_d)t + \frac{1}{2}\cos(w_c t + w_d t + \varphi)$$

represents a master signal of the output signal, $dc_i \cos(w_c t) - dc_q \sin(w_c t) + a \cos(w_c t + \theta_1) + b \cos(w_c t + \theta_2)$ represents local oscillator leakage of the output signal, and $$\frac{r}{2}\cos(w_c t + w_d)t + \frac{1}{2}\cos(w_c t + w_d t + \varphi)$$

represents mirror leakage of the output signal.

Specifically, the QMC module in the microwave integrated chip obtains the direct current component coefficient $dc_i$ of the I-channel signal and the direct current component coefficient $dc_q$ of the Q-channel signal based on a signal detected by the envelope detector tube. Therefore, the direct current component coefficient $dc_i$ of the I-channel signal and the direct current component coefficient $dc_q$ of the Q-channel signal can be used to correct local oscillator leakage that leaks in front of the variable attenuator, but the direct current component coefficient $dc_i$ of the I-channel signal and the direct current component coefficient $dc_q$ of the Q-channel signal that are generated by the QMC module cannot be used to correct the local oscillator signal that leaks behind the variable attenuator.

FIG. 2 is a schematic flowchart of a method for suppressing local oscillator signal leakage in a microwave chip according to an embodiment of the present disclosure. The method may be executed by an apparatus for suppressing local oscillator signal leakage. The microwave chip includes an oscillator, a phase shifter, a first frequency mixer, a second frequency mixer, a combiner, and a variable attenuator. The oscillator is configured to generate a local oscillator signal, the phase shifter is configured to convert the local oscillator signal into two quadrature signal components, the first frequency mixer is configured to perform frequency mixing on an inphase I-channel signal and an inphase local oscillator signal component that passes through the phase shifter, the second frequency mixer is configured to perform frequency mixing on a quadrature Q-channel signal and a quadrature local oscillator signal component that passes through the phase shifter, and the combiner is configured to perform frequency combination on a signal obtained through frequency mixing of the first frequency mixer and a signal obtained through frequency mixing of the second frequency mixer, and output an obtained signal to the variable attenuator. As shown in FIG. 2, the method 200 includes:

210. Obtain a current attenuation amount of the variable attenuator.

220. Obtain a direct current component coefficient $dc_i'$ of the I-channel signal and a direct current component coefficient $dc_q'$ of the Q-channel signal based on a local oscillator signal that leaks in front of the variable attenuator.

230. Perform weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, where the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator.

240. Send the I-channel signal with the coefficient of $dc_i$ to the first frequency mixer, and send the Q-channel signal with the coefficient of $dc_q$ to the second frequency mixer.

Specifically, in step 210, the current attenuation amount of the tunable attenuator is an attenuation value of the tunable attenuator, and the tunable attenuator is a voltage variable attenuator (VVA). For example, the attenuation amount may be 3 dB or 6 dB.

Specifically, in step 220, a QMC module for suppressing signal leakage in the microwave chip can obtain the direct current component coefficient $dc_i'$ of the I-channel signal and the direct current component coefficient $dc_q'$ of the Q-channel signal based on a signal detected by an envelope detector tube. The envelope detector tube is usually located in front of the tunable attenuator. Therefore, the envelope detector tube can be used to suppress local oscillator leakage that leaks in front of the tunable attenuator. It should be understood that, the QMC module may further obtain the direct current component coefficient $dc_i'$ of the I-channel signal and the direct current component coefficient $dc_q'$ of the Q-channel signal based on a distorted signal collected by another component with a function similar to that of the envelope detector tube. This is not limited in the present disclosure.

Specifically, in step 230, the vector of the local oscillator signal that leaks behind the tunable attenuator can be orthogonally decomposed onto the vector of the local oscillator signal that leaks in front of the tunable attenuator. The parallel component coefficient of the vector of the local oscillator signal that leaks behind the tunable attenuator on the vector of the local oscillator signal that leaks in front of the tunable attenuator is defined as the spatial leakage factor k1, and the perpendicular component coefficient of the vector of the local oscillator signal that leaks behind the tunable attenuator on the vector of the local oscillator signal that leaks in front of the tunable attenuator is defined as the spatial leakage factor k2. In other words, the vector of the local oscillator signal that leaks behind the variable attenuator may be decomposed to be parallel to and perpendicular to the vector of the local oscillator signal that leaks in front of the variable attenuator, amplitude coefficients are respectively k1 and k2, and the coefficients k1 and k2 are referred to as leakage factors.

Figure 3:
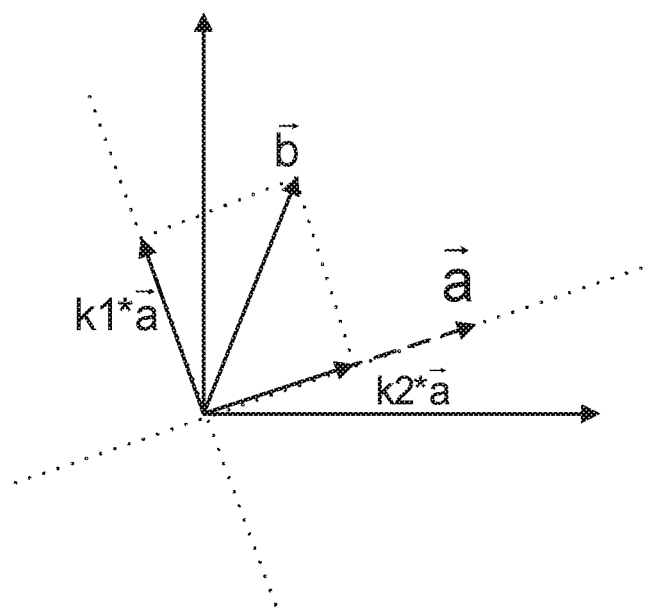
FIG. 3 is a schematic flowchart of a method for suppressing local oscillator signal leakage in a microwave chip according to an embodiment of the present disclosure.

As shown FIG. 3, $\vec{a}$ represents an amount of the local oscillator signal that leaks in front of the variable attenuator, $\vec{b}$ represents an amount of the local oscillator signal that leaks behind the variable attenuator, and $\vec{b}=k1\times\vec{a}+k2\times\vec{a}$ may be obtained.

Specifically, when the tunable attenuator is in a fully attenuated state, and after the QMC module is enabled, leakage of a local oscillator signal output by the foregoing microwave chip is $dc_i \cos(w_c t)-dc_q \sin(w_c t)+a \cos(w_c+\theta_1)+b \cos(w_c t+\theta_2)$. $a \cos(w_c+\theta_1)$ represents an amount of the local oscillator signal that leaks in front of the variable attenuator, and $b \cos(w_c t+\theta_2)$ represents an amount of the local oscillator signal that leaks behind the variable attenuator when the variable attenuator is in a fully attenuated state.

Therefore, the following relational expression (2) may also be obtained based on $\vec{b}=k1\times\vec{a}+k2\times\vec{a}$:

$$b \cos(w_c t+\theta_2)=k1*a \cos(w_c t+\theta_1)+k2*a \sin(w_c t+\theta_1) \quad (2).$$

After the QMC module is enabled, to resolve local oscillator leakage that leaks in front of the variable attenuator, it is assumed that direct current component coefficients for correcting this part of local oscillator leakage are respectively the direct current component coefficient $dc_i'$ of the I-channel signal and the direct current component coefficient $dc_q'$ of the Q-channel signal. To cancel the leakage part of $a \cos(w_c+\theta_1)$ by using $dc_i'$ and $dc_q'$, a relationship of the following Formula (3) is obtained:

$$dc_i' \cos(w_c t)-dc_q' \sin(w_c t)+a \cos(w_c t+\theta_1)=0$$

$$\Rightarrow a \cos(w_c t+\theta_1)=dc_q' \sin(w_c t)-dc_i' \cos(w_c t) \quad (3).$$

After a ¼ cycle, the foregoing equation may be changed into the following Formula (4):

$$dc_i'\cos\left(w_c t + \frac{\pi}{2}\right) - dc_q'\sin\left(w_c t + \frac{\pi}{2}\right) + a\cos\left(w_c t + \theta_1 + \frac{\pi}{2}\right) = \quad (4)$$

$$0 \Rightarrow -dc_i'\sin(w_c t) - dc_q'\cos(w_c t) - a\sin(w_c t + \theta_1) =$$

$$0 \Rightarrow a\sin(w_c t + \theta_1) = -dc_i'\sin(w_c t) - dc_q'\cos(w_c t).$$

Therefore, after the local oscillator leakage signal $dc_i \cos(w_c t)-dc_q \sin(w_c t)+a \cos(w_c+\theta_1)+b \cos(w_c t+\theta_2)$ passes through the variable attenuator with an attenuation amount of A, the following formula is obtained:

$$A\times dc_i \cos(w_c t)-A\times dc_q \sin(w_c t)+a \cos(w_c+\theta_1)+b \cos(w_c t+\theta_2) \quad (5).$$

The following relationship may be obtained by substituting a relationship of Formula (2) into Formula (5):

$$dc_i = \frac{1}{A}[dc_i' * (A + k1) + dc_q' * k2]$$

$$dc_q = \frac{1}{A}[dc_q' * (A + k1) - dc_i' * k2],$$

Therefore, to suppress local oscillator leakage to greatest extent, a final value of the foregoing Formula (6) needs to be 0. Therefore, the following relationship is needed to obtain the corrected direct current component coefficient $dc_i$ of the I-channel signal and the corrected direct current component coefficient $dc_q$ of the Q-channel signal:

$$A * dc_i \cos(w_c t) - A * dc_q \sin(w_c t) + A * a\cos(w_c + \theta_1) + b\cos(w_c t + \theta_2) =$$

$$A * dc_i \cos(w_c t) - A * dc_q \sin(w_c t) + A * a\cos(w_c + \theta_1) +$$

$$k1 * a\cos(w_c t + \theta_1) + k2 * a\sin(w_c + \theta_1) =$$

$$A * dc_i \cos(w_c t) - A * dc_q \sin(w_c t) + (A + k1) * a\cos(w_c t + \theta_1) +$$

$$k2 * a\sin(w_c + \theta_1) = A * dc_i \cos(w_c t) - A * dc_q \sin(w_c t) +$$

$$(A + k1) * dc_q'\sin(w_c t) - dc_i'\cos(w_c t)) +$$

$$k2 * (-dc_q'\cos(w_c t) - dc_i'\sin(w_c t)) = [A * dc_i - dc_i' * (A + k1) - dc_q' * k2]$$

$$\cos(w_c t) + [$$

$$-A * dc_q + dc_q' * (A + k1) - dc_i' * k2] * \sin(w_c t)$$

In Formulas (7), $dc_i'$, $dc_q'$, and the attenuation amount A are known parameters. A power value of an output signal behind the variable attenuator of the microwave chip needs to be obtained, to obtain the foregoing leakage factors k1 and k2.

Specifically, in step 240, before the I-channel signal with the coefficient of $dc_i$ is sent to the first frequency mixer, the I-channel signal with the coefficient $dc_i$ passes through the combiner and is superimposed with an I-channel modulation signal that is sent to the microwave chip; and similarly, before the Q-channel signal with the coefficient of $dc_q$ is sent to the second frequency mixer, the Q-channel signal with the coefficient of $dc_q$ passes through the combiner and is superimposed with a Q-channel modulation signal that is sent to the microwave chip, where the I-channel modulation signal and the Q-channel modulation signal are two quadrature signal components sent by a modulator to the microwave chip.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Optionally, in an embodiment of the present disclosure, the foregoing method further includes: obtaining a power value of an output signal that is generated by the microwave chip in each of at least three working states and an attenuation amount of the variable attenuator in each working state.

Specifically, the working state of the microwave chip is a working state of the microwave chip when a particular local oscillator signal output power, an attenuation value of the variable attenuator, and related parameters are determined.

Specifically, a component such as a power detector tube, a power meter, or a spectrum analyzer may be added in a position at an end of the microwave chip from which a signal is output, to obtain a power of the output signal of the microwave chip. It should be understood that, the position of the foregoing component is not limited to the end of the microwave chip, and the component may alternatively be located on a network element outside the microwave chip. This is not limited in the present disclosure.

It should be understood that, to improve detection precision of the power of the output signal of the microwave chip, a preferable manner is measuring the power of the output signal when a master signal is turned off (namely, the modulator is turned off) and a component gain of the microwave chip is maximum.

Optionally, in an embodiment of the present disclosure, a parameter that affects the working state of the microwave chip includes but is not limited to: a power of a local oscillator signal of the microwave chip, a power of an input modulation signal of the microwave chip, the attenuation value of the attenuator, the direct current component coefficient $dc_i'$ of the I-channel signal sent to the first frequency mixer, and the direct current component coefficient $dc_q'$ of the Q-channel signal sent to the second frequency mixer.

Specifically, for example, in a first working state, the tunable attenuator is in a fully attenuated state, another attenuator is in a non-attenuated state, a modulation signal is received, the parameters $dc_i'$ and $dc_q'$ of the QMC module are optimized, a master signal sent by the oscillator is turned off, and a power detector tube located behind the tunable attenuator records a detected power as $P_0$. In this case, based on the foregoing relational expression (2) $\vec{b} = k1 \times \vec{a} + k2 \times \vec{a}$, the following formula may be obtained:

$$a^2(k1^2+k2^2)=P_0 \qquad (8).$$

In a second working state, the variable attenuator is in a fully attenuated state, another attenuator is in a non-attenuated state, a master signal sent by the oscillator is turned off, both the parameters $dc_i'$ and $dc_q'$ of the QMC module are 0, and a detected power is recorded as $P_1$; and based on the foregoing relational expression (2), the following formula may be obtained:

$$a^2[(k1+1)^2+k2^2]=P_1 \qquad (9),$$

In a third working state, a gain of the variable attenuator is increased by 6 dB, another attenuator is in a non-attenuated state, a master signal sent by the oscillator is turned off, both the parameters $dc_i'$ and $dc_q'$ of the QMC module are 0, and a detected power is recorded as $P_2$; and based on the foregoing relational expression (2), the following formula may be obtained:

$$a^2[(k1+2)^2+k2^2]=P_2 \qquad (10), \text{ where}$$

$\vec{a}$ represents an amount of the local oscillator signal that leaks in front of the variable attenuator, and $\vec{b}$ represents an amount of the local oscillator signal that leaks behind the variable attenuator.

It should be understood that, the foregoing three working states are merely examples, and the present disclosure is not limited thereto.

Optionally, in an embodiment of the present disclosure, the spatial leakage factors k1 and k2 of the microwave chip are determined based on the power value of the signal that is generated in each of the at least three working states and the attenuation amount of the variable attenuator in each working state; and the corrected direct current component coefficient $dc_i$ of the I-channel signal sent to the first frequency mixer and the corrected direct current component coefficient $dc_q$ of the Q-channel signal sent to the second frequency mixer are determined based on the spatial leakage factors k1 and k2 of the microwave chip and the current attenuation amount of the variable attenuator, so that the local oscillator leakage of the microwave chip is 0.

Specifically, the following may be obtained based on the foregoing equations (8) to (10):

the following formulas (11) may be obtained from Formulas (8) and (9):

$$k1 = \frac{(P_1 - P_0)}{(P_0 + P_2 - 2*P_1)} - \frac{1}{2} \qquad (11)$$

$$k2 = \sqrt{\frac{2*(2P_1 - P_2)}{(P_0 + P_2 - 2*P_1)} - k1^2 + 2}.$$

Therefore, $dc_i$ and $dc_q$ can be obtained by separately substituting the coefficients k1 and k2 into Formulas (7).

The spatial leakage factors k1 and k2 in this solution can be deduced by using any three (or more than three) powers. Therefore, all deduced spatial leakage factors k1 and k2 fall within the protection scope of the present disclosure.

Optionally, in an embodiment of the present disclosure, the determining, based on the spatial leakage factors k1 and k2 of the microwave chip and the current attenuation value of the variable attenuator, the corrected direct current component coefficient $dc_i$ of the i-channel signal sent to the first frequency mixer and the corrected direct current component coefficient $dc_q$ of the Q-channel signal sent to the second frequency mixer includes:

obtaining, based on the leakage factors k1 and k2 obtained in the foregoing embodiment and by using the following Formulas (7), the corrected direct current component coefficient $dc_i$ of the I-channel signal sent to the first frequency mixer and the corrected direct current component coefficient $dc_q$ of the Q-channel signal sent to the second frequency mixer:

$$dc_i = \frac{1}{A}[dc'_i * (A + k1) + dc'_q * k2]$$

$$dc_q = \frac{1}{A}[dc'_q * (A + k1) - dc'_i * k2],$$

where

A is an attenuation value of the variable attenuator.

Optionally, in an embodiment of the present disclosure, the obtaining a power value of an output signal that is generated by the microwave chip in each of at least three working states and an attenuation amount of the variable attenuator in each working state includes: when the microwave chip is in a frequency division duplex working mode, obtaining, in an initialization process of the microwave chip, the power value of the output signal that is generated by the microwave chip in each of the at least three working states; or when the microwave chip is in a time division duplex working mode, obtaining, in an initialization process and/or a receiving timeslot of the microwave chip, the power value of the output signal that is generated by the microwave chip in each of the at least three working states.

In other words, for a frequency division duplex (FDD) system, the spatial leakage factors k1 and k2 are extracted in the initialization process of the microwave chip; and for a time division duplex (TDD) system, the spatial leakage factors k1 and k2 may be extracted in the initialization process or the receiving timeslot of the microwave chip.

The present disclosure can resolve spatial leakage of a local oscillator signal. A TX_QMC solution for a single module can resolve a problem that spatial leakage cannot be corrected. An RX-TXQMC solution for pairing modules can resolve a problem that a static QMC coefficient deteriorates as an attenuation status varies; and an LO_NULLING solution for a non-zero intermediate frequency system can improve a suppression degree of LO_NULLING that varies with power.

Specifically, in an aspect of improving system performance, a local oscillator leakage suppression degree is improved by more than 10 dB compared with that in an existing solution, and a transmission template problem in a large bandwidth radio frequency communications system is resolved; and in an aspect of reducing system design difficulty, some costs of local oscillator suppression resolved from a hardware perspective are reduced, and a requirement on an existing QMC algorithm capability is lowered. Further, production and manufacturing costs can be reduced, and a static QMC parameter table making step and the like can be omitted.

In this embodiment of the present disclosure, weighting on the direct current component coefficient $dc'_i$ of the I-channel signal and the direct current component coefficient $dc'_q$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Figure 4:
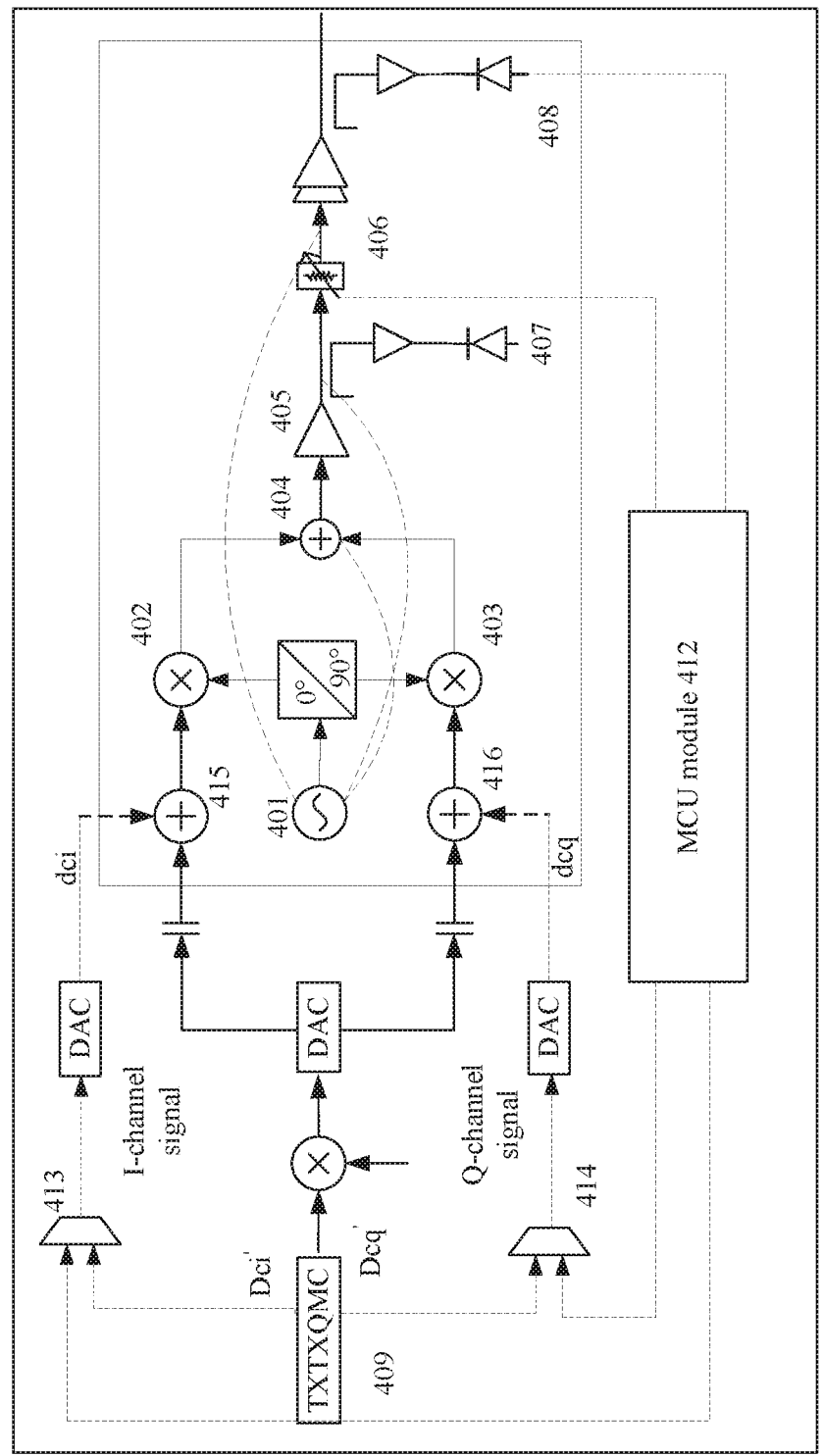
FIG. 4 is a schematic architectural diagram of a method for suppressing local oscillator signal leakage in a microwave chip according to an embodiment of the present disclosure.

FIG. 4 is a schematic architectural diagram of a method for suppressing local oscillator signal leakage in a microwave chip according to an embodiment of the present disclosure.

As shown in FIG. 4, the architecture includes three parts: a microwave integrated chip, a microcontroller unit (MCU) module, and a QMC module.

Specifically, in the microwave integrated chip, an oscillator 401 is configured to provide a local oscillator signal for a frequency mixer, the frequency mixer is configured to up-convert an inphase signal component and a quadrature signal component of the local oscillator signal to a radio frequency or microwave signal, an I-channel signal sent by a modulator and the inphase signal component of the local oscillator signal are frequency-mixed by a first frequency mixer 402, a Q-channel signal sent by the modulator and the quadrature signal component of the local oscillator signal are frequency-mixed by a second frequency mixer 403, signals obtained through frequency mixing are output to a combiner 404 for frequency combination, and a signal obtained by the combiner 404 is amplified by an amplifier 405 and is finally output. A tunable attenuator 406 in this embodiment of the present disclosure may be a voltage variable attenuator (VVA). The VVA can implement variable tuning on a signal by adjusting an attenuation amount. An envelope detector tube 407 is configured to detect an envelope of a modulation signal, and collect distorted information. Further, a detector tube 408 is added behind the VVA, and is configured to perform power detection. It should be understood that, the detector tube 408 may alternatively be connected to an output end of the microwave chip. This is not limited in the present disclosure.

Specifically, the QMC module includes a transmission TXTXQMC unit 409, a third frequency mixer 410, and a digital-to-analog converter (DAC) 411. The QMC module is configured to determine, by comparing a sent signal with a distorted signal detected by an envelope, a direct current component coefficient $dc_i'$ of an I-channel signal that can correct local oscillator leakage that leaks in front of the VVA and a direct current component coefficient $dc_q'$ of a Q-channel signal that can correct local oscillator leakage that leaks in front of the VVA.

Specifically, an MCU module 412 is configured to perform data processing and storage, and processing of a software process. The MCU module 412 further includes a first MCU unit 413 and a second MCU unit 414. The MCU module 412 is separately connected to the detector tube 408, the QMC unit 409, a variable attenuator 407, and the like, and can obtain a signal of the detector tube 408 and an attenuation value of the variable attenuator 407. The MCU module 412 can determine leakage factors k1 and k2 based on a power value of an output signal of the microwave chip measured by the detector tube 408 and the attenuation value of the variable attenuator 407, and the first MCU unit 413 corrects the direct current component coefficient $dc_i'$ of the I-channel signal, to obtain a corrected direct current component coefficient $dc_i$ of the I-channel signal; and the second MCU unit 414 corrects the direct current component coefficient $dc_q'$ of the Q-channel signal, to obtain a corrected direct current component coefficient of the Q-channel signal.

Specifically, in local oscillator $dc_i \cos(w_c t) - dc_q \sin(w_c t) + a \cos(w_c t + \theta_1) + b \cos(w_c t + \theta_2)$ of the output signal, a $\cos(w_c t + \theta_1)$ represents an amount of the local oscillator signal that leaks in front of the variable attenuator 407

(namely, the VVA), and b cos($w_c t+\theta_2$) represents an amount of the local oscillator signal that leaks behind the VVA when the VVA is in a fully attenuated state.

A vector of a local oscillator signal that leaks behind the VVA may be decomposed to be parallel to and perpendicular to a vector of a local oscillator signal that leaks in front of the VVA, amplitude coefficients are respectively k1 and k2, and the coefficients k1 and k2 are referred to as leakage factors.

Assuming that $\vec{a}$ represents an amount of the local oscillator signal that leaks in front of the VVA, and that $\vec{b}$ represents an amount of the local oscillator signal that leaks behind the VVA, $\vec{b}=k1\times\vec{a}+k2\times\vec{a}$ is obtained; to be specific, the following relational expression (2) may be obtained:

$$b\cos(w_c t+\theta_2)=k1*a\cos(w_c t+\theta_1)+k2*a\sin(w_c t+\theta_1) \quad (2).$$

After the QMC module is enabled, to resolve the local oscillator leakage that leaks in front of the VVA, it is assumed that direct current component coefficients for correcting this part of local oscillator leakage are respectively $dc_i'$ and $dc_q'$. To cancel the leakage part of $a\cos(w_c+\theta_1)$ by using $dc_i'$ and $dc_q'$, a relationship of the following Formula (3) is obtained:

$$dc_i'\cos(w_c t)-dc_q'\sin(w_c t)+a\cos(w_c t+\theta_1)=0$$

$$\Rightarrow a\cos(w_c t+\theta_1)=dc_q'\sin(w_c t)-dc_i'\cos(w_c t) \quad (3).$$

After a ¼ cycle, the foregoing equation may be changed into the following Formula (4):

$$dc_i'\cos\left(w_c t+\frac{\pi}{2}\right)-dc_q'\sin\left(w_c t+\frac{\pi}{2}\right)+a\cos\left(w_c t+\theta_1+\frac{\pi}{2}\right)= \quad (4)$$
$$0 \Rightarrow -dc_i'\sin(w_c t)-dc_q'\cos(w_c t)-a\sin(w_c t+\theta_1)=$$
$$0 \Rightarrow a\sin(w_c t+\theta_1)=-dc_i'\sin(w_c t)-dc_q'\cos(w_c t).$$

Therefore, after the local oscillator leakage signal $dc_i\cos(w_c t)-dc_q\sin(w_c t)+a\cos(w_c+\theta_1)+b\cos(w_c t+\theta_2)$ passes through the VVA with an attenuation amount of A, the following formula is obtained:

$$A\times dc_i\cos(w_c t)-A\times dc_q\sin(w_c t)+a\cos(w_c t+\theta_1)+b\cos(w_c t+\theta_2) \quad (5).$$

The following relationship may be obtained by substituting a relationship of Formula (2) into Formula (5):

$$A*dc_i\cos(w_c t)-A*dc_q\sin(w_c t)+A*a\cos(w_c+\theta_1)+b\cos(w_c t+\theta_2)=$$
$$A*dc_i\cos(w_c t)-A*dc_q\sin(w_c t)+A*a\cos(w_c+\theta_1)+$$
$$k1*a\cos(w_c t+\theta_1)+k2*a\sin(w_c+\theta_1)=$$
$$A*dc_i\cos(w_c t)-A*dc_q\sin(w_c t)+(A+k1)*a\cos(w_c t+\theta_1)+$$
$$k2*a\sin(w_c+\theta_1)=A*dc_i\cos(w_c t)-A*dc_q\sin(w_c t)+$$
$$(A+k1)*dc_q'\sin(w_c t)-dc_i'\cos(w_c t))+$$
$$k2*(-dc_q'\cos(w_c t)-dc_i'\sin(w_c t))=[A*dc_i-dc_i'*(A+k1)-dc_q'*k2]$$
$$\cos(w_c t)+[$$
$$-A*dc_q+dc_q'*(A+k1)-dc_i'*k2]*\sin(w_c t)$$

Therefore, to suppress local oscillator leakage to greatest extent, a final value of the foregoing Formula (6) needs to be 0. Therefore, the following relationship is needed:

$$dc_i=\frac{1}{A}[dc_i'*(A+k1)+dc_q'*k2] \quad (7)$$

$$dc_q=\frac{1}{A}[dc_q'*(A+k1)-dc_i'*k2].$$

In Formulas (7), $dc_i'$, $dc_q'$, and the attenuation amount A are known parameters. The MCU module 412 needs to obtain, through power detection, a power value of a circuit that is behind the VVA, to determine the leakage factors k1 and k2.

Specifically, a method for determining k1 and k2 through calculation in the MCU module 412 is as follows:

The VVA is in a fully attenuated state, another attenuator is in a non-attenuated state, the modulator sends a modulation signal, the parameters $dc_i'$ and $dc_q'$ of the QMC module are optimized, a master signal is turned off, and a power detector tube located behind the VVA records a detected power as $P_0$. In this case, the following formula may be obtained:

$$a^2(k1^2+k2^2)=P_0 \quad (8).$$

The VVA is in a fully attenuated state, another attenuator is in a non-attenuated state, a master signal is turned off, both bypass QMC parameters $dc_i'$ and $dc_q'$ are 0, and a detected power is recorded as $P_1$. In this case, the following formula may be obtained:

$$a^2[(k1+1)^2+k2^2]=P_1 \quad (9).$$

A gain of the VVA is increased by 6 dB, another attenuator is in a non-attenuated state, a master signal is turned off, both the bypass QMC parameters $dc_i'$ and $dc_q'$ are 0, and a detected power is recorded as $P_2$. In this case, the following formula may be obtained:

$$a^2[(k1+2)^2+k2^2]=P_2 \quad (10).$$

The following formulas may be obtained from Formulas (8) to (10):

$$k1=\frac{(P_1-P_0)}{(P_0+P_2-2*P_1)}-\frac{1}{2} \quad (11)$$

$$k2=\sqrt{\frac{2*(2P_1-P_2)}{(P_0+P_2-2*P_1)}-k1^2+2}.$$

Therefore, $dc_i$ and $dc_q$ can be obtained by separately substituting the coefficients k1 and k2 in Equations (11) into Formulas (7). A process of calculating the leakage factors k1 and k2 based on the power value of the output signal of the foregoing microwave chip is implemented by the MCU module 412, a process of determining the corrected direct current component coefficient $dc_i$ of the I-channel signal by using Formulas (7) may be implemented in the first MCU unit 413, and a process of determining the corrected direct current component coefficient $dc_q$ of the Q-channel signal by using Formulas (7) may be implemented in the first MCU unit 414.

The spatial leakage factors k1 and k2 in this solution can be deduced by using any three (or more than three) powers. Therefore, all deduced spatial leakage factors k1 and k2 fall within the protection scope of the present disclosure.

Further, the I-channel direct current signal with the coefficient of $dc_i$ and the Q-channel direct current signal with the coefficient of $dc_q$ are respectively sent to the microwave chip by using a combiner 415 and a combiner 416.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and a current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Figure 5:
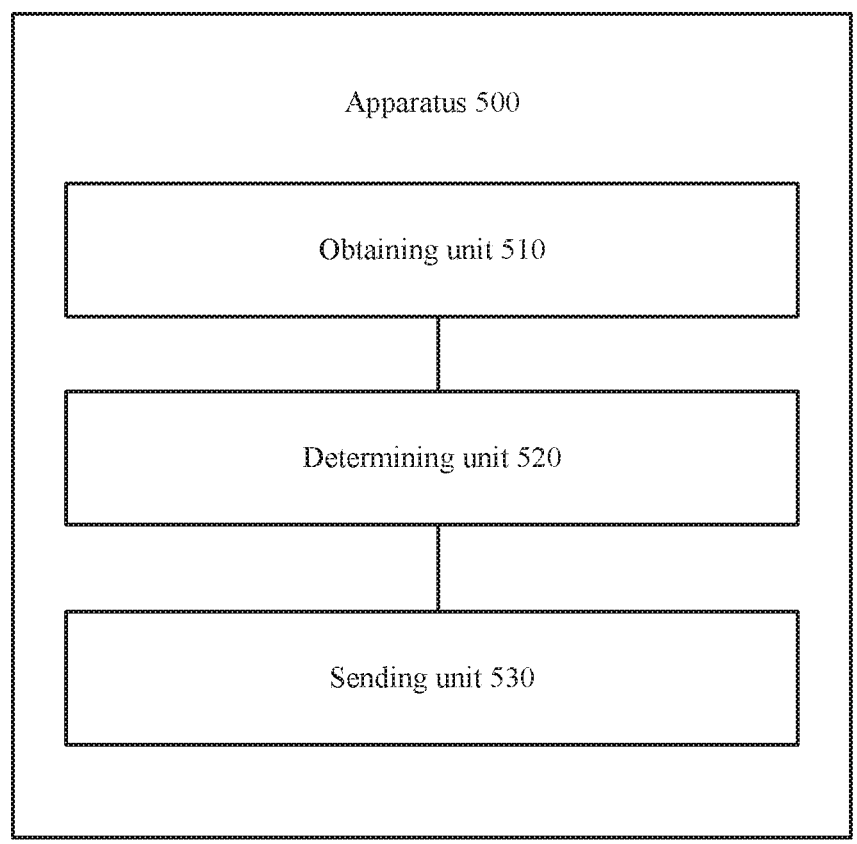
FIG. 5 is a schematic structural block diagram of a working apparatus according to an embodiment of the present disclosure.

FIG. 5 is a schematic structural block diagram of an apparatus according to an embodiment of the present disclosure. As shown in FIG. 5, FIG. 5 shows the apparatus 500 for suppressing local oscillator signal leakage in a microwave chip. The microwave chip includes an oscillator, a phase shifter, a first frequency mixer, a second frequency mixer, a combiner, and a variable attenuator. The oscillator is configured to generate a local oscillator signal, the phase shifter is configured to convert the local oscillator signal into two quadrature signal components, the first frequency mixer is configured to perform frequency mixing on an inphase I-channel signal and an inphase local oscillator signal component that passes through the phase shifter, the second frequency mixer is configured to perform frequency mixing on a quadrature Q-channel signal and a quadrature local oscillator signal component that passes through the phase shifter, and the combiner is configured to perform frequency combination on a signal obtained through frequency mixing of the first frequency mixer and a signal obtained through frequency mixing of the second frequency mixer, and output an obtained signal to the variable attenuator. The apparatus 500 includes:

an obtaining unit 510, configured to obtain a current attenuation amount of the variable attenuator, where the obtaining unit 510 is further configured to obtain a direct current component coefficient $dc_i'$ of the I-channel signal and a direct current component coefficient $dc_q'$ of the Q-channel signal based on a local oscillator signal that leaks in front of the variable attenuator;

a determining unit 520, configured to perform weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, where the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and a sending unit 530, configured to send the I-channel signal with the coefficient of $dc_i$ to the first frequency mixer, and send the Q-channel signal with the coefficient of $dc_q$ to the second frequency mixer.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Optionally, in an embodiment of the present disclosure, the obtaining unit 510 is further configured to obtain a power value of an output signal that is generated by the microwave chip in each of at least three working states and an attenuation amount of the variable attenuator in each working state; and the sending unit 540 is further configured to determine the spatial leakage factors k1 and k2 of the microwave chip based on the power value of the signal that is generated in each of the at least three working states and the attenuation amount of the variable attenuator in each working state.

Optionally, in an embodiment of the present disclosure, the determining unit 520 is specifically configured to determine the corrected direct current component coefficient $dc_i$ of the I-channel signal and the corrected direct current component coefficient $dc_q$ of the Q-channel signal by using the following formulas:

$$dc_i = \frac{1}{A}[dc_i' * (A + k1) + dc_q' * k2]$$

$$dc_q = \frac{1}{A}[dc_q' * (A + k1) - dc_i' * k2],$$

where

A is an attenuation value of the variable attenuator.

Optionally, in an embodiment of the present disclosure, a parameter for representing the working state includes at least one of the following: a power of a local oscillator signal of the microwave chip, a power of an input modulation signal of the microwave chip, the attenuation amount of the attenuator, the direct current component coefficient $dc_i'$ of the I-channel signal, and the direct current component coefficient $dc_q'$ of the Q-channel signal.

Optionally, in an embodiment of the present disclosure, the obtaining unit 510 is further configured to: when the microwave chip is in a frequency division duplex working mode, obtain, in an initialization process of the microwave chip, the power of the output signal that is generated by the microwave chip in each of the at least three working states; or when the microwave chip is in a time division duplex working mode, obtain, in an initialization process and/or a receiving timeslot of the microwave chip, the power value of the output signal that is generated by the microwave chip in each of the at least three working states.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Figure 6:
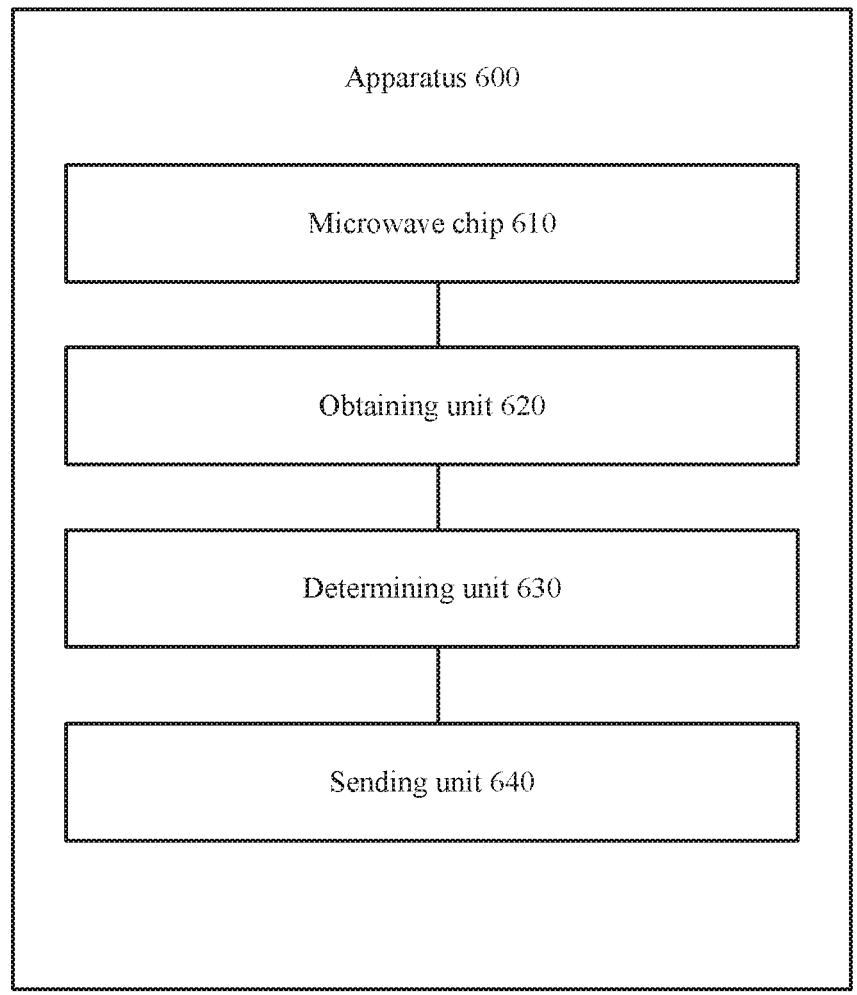
FIG. 6 is a schematic structural block diagram of a working apparatus according to another embodiment of the present disclosure.

FIG. 6 is a schematic structural block diagram of a working apparatus according to another embodiment of the present disclosure. As shown in FIG. 6, FIG. 6 shows the apparatus 600 for suppressing local oscillator signal leakage in a microwave chip. The apparatus 600 includes:

a microwave chip 610, including an oscillator, a phase shifter, a first frequency mixer, a second frequency mixer, a combiner, and a variable attenuator, where the oscillator is configured to generate a local oscillator signal, the phase shifter is configured to convert the local oscillator signal into two quadrature signal components, the first frequency mixer is configured to perform frequency mixing on an inphase I-channel signal and an inphase local oscillator signal component that passes through the phase shifter, the second frequency mixer is configured to perform frequency mixing on a quadrature Q-channel signal and a quadrature local oscillator signal component that passes through the phase shifter, and the combiner is configured to perform frequency combination on a signal obtained through frequency mixing of the first frequency mixer and a signal obtained through frequency mixing of the second frequency mixer, and output an obtained signal to the variable attenuator;

an obtaining unit 620, configured to obtain a current attenuation amount of the variable attenuator, where the obtaining unit is further configured to obtain a direct current component coefficient $dc_i'$ of the I-channel signal and a direct current component coefficient $dc_q'$ of the Q-channel signal based on a local oscillator signal that leaks in front of the variable attenuator;

a determining unit 630, configured to perform weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, where the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and a sending unit 640, configured to send the I-channel signal with the coefficient of $dc_i$ to the first frequency mixer, and send the Q-channel signal with the coefficient of $dc_q$ to the second frequency mixer.

In this embodiment of the present disclosure, weighting on the direct current component coefficient $dc_i'$ of the I-channel signal and the direct current component coefficient $dc_q'$ of the Q-channel signal is performed based on the spatial leakage factors k1 and k2 of the microwave chip and the current attenuation amount of the tunable attenuator, to determine the corrected direct current component coefficient $dc_i$ of the I-channel signal and the corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Figure 7:
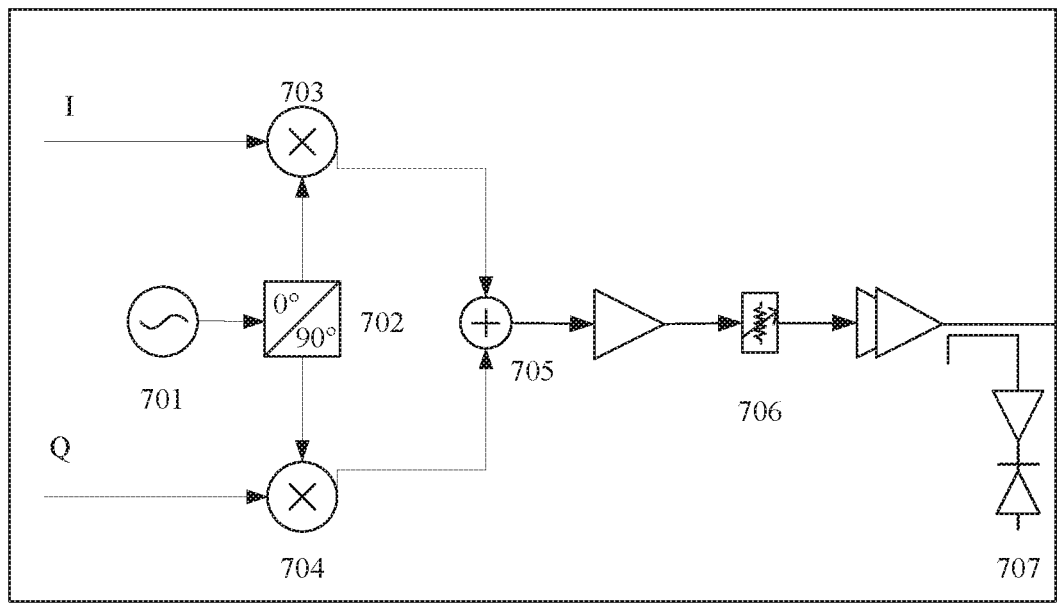
FIG. 7 is a schematic structural block diagram of a microwave chip according to an embodiment of the present disclosure.

FIG. 7 is a schematic structural block diagram of a microwave chip according to an embodiment of the present disclosure. As shown in FIG. 7, the microwave chip 700 includes an oscillator 701, a phase shifter 702, a first frequency mixer 703, a second frequency mixer 704, a combiner 705, a variable attenuator 706, and a power detector element 707.

The oscillator 701 is configured to generate a local oscillator signal, the phase shifter 702 is configured to convert the local oscillator signal into two quadrature signal components, the first frequency mixer 703 is configured to perform frequency mixing on an inphase I-channel signal and an inphase local oscillator signal component that passes through the phase shifter, the second frequency mixer 704 is configured to perform frequency mixing on a quadrature Q-channel signal and a quadrature local oscillator signal component that passes through the phase shifter, the combiner 705 is configured to perform frequency combination on a signal obtained through frequency mixing of the first frequency mixer 703 and a signal obtained through frequency mixing of the second frequency mixer 704, and output an obtained signal to the variable attenuator 706, and the power detector element 707 is configured to detect a power value of an output signal of the microwave chip.

Specifically, the detector element 707 may be an element such as a power detector tube or a power meter. This is not limited in the present disclosure.

In this embodiment of the present disclosure, weighting on a direct current component coefficient $dc_i'$ of an I-channel signal and a direct current component coefficient $dc_q'$ of a Q-channel signal is performed based on spatial leakage factors k1 and k2 of the microwave chip and a current attenuation amount of the tunable attenuator, to determine a corrected direct current component coefficient $dc_i$ of the I-channel signal and a corrected direct current component coefficient $dc_q$ of the Q-channel signal, and a direct current component superimposed to the I-channel signal of the microwave chip and a direct current component superimposed to the Q-channel signal of the microwave chip are respectively determined based on the corrected direct current component coefficient $dc_i$ of the I-channel signal and the corrected direct current component coefficient $dc_q$ of the Q-channel signal. Therefore, local oscillator leakage in the microwave chip can be effectively suppressed, system performance of the microwave chip can be improved, system design difficulty can be reduced, and production and manufacturing costs can be decreased.

Figure 8:
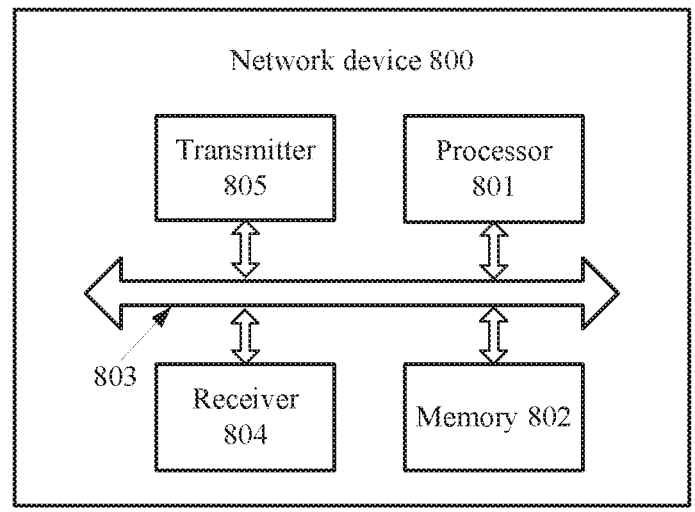
FIG. 8 is a schematic structural block diagram of an apparatus according to another embodiment of the present disclosure.

FIG. 8 is a schematic structural block diagram of an apparatus according to another embodiment of the present disclosure. As shown in FIG. 8, this embodiment of the present disclosure further provides the apparatus 800. The apparatus 800 includes a processor 801, a memory 802, a bus system 803, and a receiver 804. The processor 801, the memory 802, and the receiver 804 are connected by using the bus system 803. The memory 802 is configured to store an instruction. The processor 801 is configured to execute the instruction stored in the memory 802, and control the receiver 804 to receive information. The apparatus 800 can implement corresponding processes in the foregoing method embodiments. To avoid repetition, details are not described herein again.

It should be understood that in this embodiment of the present disclosure, the processor 801 may be a central processing unit (CPU), or the processor 801 may be another general purpose processor, a digital signal processor (DSP), an application-specific integrated circuit (ASIC), a field programmable gate array (FPGA) or another programmable logic device, a discrete gate or transistor logic device, a discrete hardware component, or the like. The general purpose processor may be a microprocessor, or the processor may be any conventional processor or the like.

The memory 802 may include a read-only memory and a random access memory, and provide the instruction and data for the processor 801. A part of the memory 802 may further include a non-volatile random access memory. For example, the memory 802 may further store device type information.

The bus system 803 may further include a power bus, a control bus, a status signal bus, and the like, in addition to a data bus. However, for clear description, various types of buses in the figure are all marked as the bus system 803.

In an implementation process, steps in the foregoing methods may be implemented by using a hardware integrated logic circuit in the processor 801, or by using instructions in a form of software. The steps of the methods disclosed with reference to the embodiments of the present disclosure may be directly performed by a hardware processor, or may be performed by using a combination of hardware in the processor and a software module. The software module may be located in a mature storage medium in the art, such as a random access memory, a flash memory, a read-only memory, a programmable read-only memory, an electrically erasable programmable memory, or a register. The storage medium is located in the memory 802, and the processor 801 reads information in the memory 802 and completes the steps in the foregoing methods in combination with hardware of the processor. To avoid repetition, details are not described herein again.

A person of ordinary skill in the art may be aware that units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or may be integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected depending on actual requirements, to achieve the objectives of the solutions of the embodiments.

In addition, functional units in the embodiments of the present disclosure may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present disclosure. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method for suppressing local oscillator signal leakage in a microwave chip, wherein the microwave chip comprises an oscillator configured to generate a local oscillator signal, a phase shifter configured to convert the local oscillator signal into an inphase local oscillator signal component and a quadrature local oscillator signal component, a first frequency mixer configured to perform frequency mixing on an inphase I-channel signal and the inphase local oscillator signal component, a second frequency mixer configured to perform frequency mixing on a quadrature Q-channel signal and the quadrature local oscillator signal component, a combiner configured to perform frequency combination on a signal obtained through frequency mixing of the first frequency mixer and a signal obtained through frequency mixing of the second frequency mixer and output an obtained signal to a variable attenuator, the method comprising:
obtaining a current attenuation amount of the variable attenuator;
obtaining a direct current component coefficient $dc_i'$ of the I-channel signal and a direct current component coefficient $dc_q'$ of the Q-channel signal based on a local oscillator signal that leaks in front of the variable attenuator;
performing weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, wherein the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and
sending the I-channel signal with the coefficient of $dc_i$ to the first frequency mixer, and sending the Q-channel signal with the coefficient of $dc_q$ to the second frequency mixer.

2. The method according to claim 1, further comprising:
obtaining a power value of an output signal that is generated by the microwave chip in each of at least three working states and an attenuation amount of the variable attenuator in each working state; and
determining the spatial leakage factors k1 and k2 of the microwave chip based on the power value of the signal that is generated in each of the at least three working states and the attenuation amount of the variable attenuator in each working state.

3. The method according to claim 1, wherein performing weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal comprises:
determining the corrected direct current component coefficient $dc_i$ of the I-channel signal and the corrected direct current component coefficient $dc_q$ of the Q-channel signal by using the following formulas:

$$dc_i = \frac{1}{A}[dc_i' * (A + k1) + dc_q' * k2]$$

$$dc_q = \frac{1}{A}[dc_q' * (A + k1) - dc_i' * k2],$$

wherein
A is an attenuation value of the variable attenuator.

4. The method according to claim 2, wherein a parameter for representing the working state comprises at least one of the following:

a power of a local oscillator signal of the microwave chip, a power of an input modulation signal of the microwave chip, the attenuation amount of the variable attenuator, the direct current component coefficient $dc_i'$ of the I-channel signal, and the direct current component coefficient $dc_q'$ of the Q-channel signal.

5. The method according to claim 2, wherein obtaining a power value of an output signal that is generated by the microwave chip in each of at least three working states and an attenuation amount of the variable attenuator in each working state comprises:
when the microwave chip is in a frequency division duplex working mode, obtaining, in an initialization process of the microwave chip, the power value of the output signal that is generated by the microwave chip in each of the at least three working states; or
when the microwave chip is in a time division duplex working mode, obtaining, in an initialization process and/or a receiving timeslot of the microwave chip, the power value of the output signal that is generated by the microwave chip in each of the at least three working states.

6. An apparatus for suppressing local oscillator signal leakage in a microwave chip, wherein the microwave chip comprises an oscillator configured to generate a local oscillator signal, a phase shifter configured to convert the local oscillator signal into an inphase local oscillator signal component and a quadrature local oscillator signal component, a first frequency mixer configured to perform frequency mixing on an inphase I-channel signal and the inphase local oscillator signal component, a second frequency mixer configured to perform frequency mixing on a quadrature Q-channel signal and the quadrature local oscillator signal component, a combiner configured to perform frequency combination on a signal obtained through frequency mixing of the first frequency mixer and a signal obtained through frequency mixing of the second frequency mixer and output an obtained signal to a variable attenuator, the apparatus comprising:
a controller configured to:
obtain a current attenuation amount of the variable attenuator;
obtain a direct current component coefficient $dc_i'$ of the I-channel signal and a direct current component coefficient $dc_q'$ of the Q-channel signal based on a local oscillator signal that leaks in front of the variable attenuator;
perform weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, wherein the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and
send the I-channel signal with the coefficient of $dc_i$ to the first frequency mixer, and send the Q-channel signal with the coefficient of $dc_q$ to the second frequency mixer.

7. The apparatus according to claim 6, wherein the controller is further configured to:
obtain a power value of an output signal that is generated by the microwave chip in each of at least three working states and an attenuation amount of the variable attenuator in each working state; and
determine the spatial leakage factors k1 and k2 of the microwave chip based on the power value of the signal that is generated in each of the at least three working states and the attenuation amount of the variable attenuator in each working state.

8. The apparatus according to claim 6, wherein the controller is configured to:
determine the corrected direct current component coefficient $dc_i$ of the i-channel signal and the corrected direct current component coefficient $dc_q$ of the Q-channel signal by using the following formulas:

$$dc_i = \frac{1}{A}[dc_i' * (A + k1) + dc_q' * k2]$$

$$dc_q = \frac{1}{A}[dc_q' * (A + k1) - dc_i' * k2],$$

wherein
A is an attenuation value of the variable attenuator.

9. The apparatus according to claim 7, wherein a parameter for representing the working state comprises at least one of the following:
a power of a local oscillator signal of the microwave chip, a power of an input modulation signal of the microwave chip, the attenuation amount of the attenuator, the direct current component coefficient $dc_i'$ of the I-channel signal, and the direct current component coefficient $dc_q'$ of the Q-channel signal.

10. The apparatus according to claim 7, wherein the controller is further configured to:
when the microwave chip is in a frequency division duplex working mode, obtain, in an initialization process of the microwave chip, the power value of the output signal that is generated by the microwave chip in each of the at least three working states; or
when the microwave chip is in a time division duplex working mode, obtain, in an initialization process and/or a receiving timeslot of the microwave chip, the power value of the output signal that is generated by the microwave chip in each of the at least three working states.

11. The apparatus according to claim 6, further comprising:
the microwave chip, and wherein the microwave chip comprises the oscillator, the phase shifter, the first frequency mixer, the second frequency mixer, the combiner, and the variable attenuator.

12. A transceiver, comprising:
an apparatus for suppressing local oscillator signal leakage in a microwave chip, wherein the microwave chip comprises an oscillator configured to generate a local oscillator signal, a phase shifter configured to convert the local oscillator signal into an inphase local oscillator signal component and a quadrature local oscillator signal component, a first frequency mixer configured to perform frequency mixing on an inphase I-channel signal and the inphase local oscillator signal component, a second frequency mixer configured to perform frequency mixing on a quadrature Q-channel signal and the quadrature local oscillator signal component, a combiner configured to perform frequency combination on a signal obtained through frequency mixing of the first frequency mixer and a signal obtained through frequency mixing of the second frequency mixer and output an obtained signal to a variable attenuator, and wherein the apparatus comprises:
a controller configured to:
obtain a current attenuation amount of the variable attenuator;
obtain a direct current component coefficient $dc_i'$ of the I-channel signal and a direct current component coefficient $dc_q'$ of the Q-channel signal based on a local oscillator signal that leaks in front of the variable attenuator;
perform weighting on the direct current component coefficient $dc_i'$ of the I-channel signal and the direct current component coefficient $dc_q'$ of the Q-channel signal based on spatial leakage factors k1 and k2 of the microwave chip and the current attenuation amount of the tunable attenuator, to determine a corrected direct current component coefficient $dc_i$ of the I-channel signal and a corrected direct current component coefficient $dc_q$ of the Q-channel signal, wherein the spatial leakage factors k1 and k2 are respectively a parallel component coefficient and a perpendicular component coefficient of a vector of a local oscillator signal that leaks behind the variable attenuator on a vector of the local oscillator signal that leaks in front of the variable attenuator; and
send the I-channel signal with the coefficient of $dc_i$ to the first frequency mixer, and send the Q-channel signal with the coefficient of $dc_q$ to the second frequency mixer.

13. The transceiver according to claim 12, wherein the controller is further configured to:
obtain a power value of an output signal that is generated by the microwave chip in each of at least three working states and an attenuation amount of the variable attenuator in each working state; and
the sending unit is further configured to determine the spatial leakage factors k1 and k2 of the microwave chip based on the power value of the signal that is generated in each of the at least three working states and the attenuation amount of the variable attenuator in each working state.

14. The transceiver according to claim 12, wherein the controller is configured to:
determine the corrected direct current component coefficient $dc_i$ of the I-channel signal and the corrected direct current component coefficient $dc_q$ of the Q-channel signal by using the following formulas:

$$dc_i = \frac{1}{A}[dc_i' * (A + k1) + dc_q' * k2]$$

$$dc_q = \frac{1}{A}[dc_q' * (A + k1) - dc_i' * k2],$$

wherein
A is an attenuation value of the variable attenuator.

15. The transceiver according to claim 13, wherein a parameter for representing the working state comprises at least one of the following:

a power of a local oscillator signal of the microwave chip, a power of an input modulation signal of the microwave chip, the attenuation amount of the attenuator, the direct current component coefficient $dc_i'$ of the I-channel signal, and the direct current component coefficient $dc_q'$ of the Q-channel signal.

16. The transceiver according to claim 13, wherein the controller is further configured to:
when the microwave chip is in a frequency division duplex working mode, obtain, in an initialization process of the microwave chip, the power value of the output signal that is generated by the microwave chip in each of the at least three working states; or
when the microwave chip is in a time division duplex working mode, obtain, in an initialization process and/or a receiving timeslot of the microwave chip, the power value of the output signal that is generated by the microwave chip in each of the at least three working states.

17. The transceiver according to claim 12, wherein the apparatus further comprises:
the microwave chip, and the microwave chip comprises the oscillator, the phase shifter, the first frequency mixer, the second frequency mixer, the combiner, and the variable attenuator.

* * * * *